United States Patent
Chaudhry et al.

(10) Patent No.: US 7,509,606 B2
(45) Date of Patent: Mar. 24, 2009

(54) METHOD FOR OPTIMIZING POWER IN A VERY LARGE SCALE INTEGRATION (VLSI) DESIGN BY DETECTING CLOCK GATING OPPORTUNITIES

(75) Inventors: Rajat Chaudhry, Austin, TX (US);
Tilman Gloekler, Gaertringen (DE);
Daniel L. Stasiak, Austin, TX (US);
Todd E. Swanson, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 11/380,126

(22) Filed: Apr. 25, 2006

(65) Prior Publication Data
US 2007/0250798 A1    Oct. 25, 2007

(51) Int. Cl.
*G06F 17/50* (2006.01)

(52) U.S. Cl. .................................. 716/5; 716/2; 716/4

(58) Field of Classification Search ............... 716/1, 716/2, 4, 5; 703/18; 327/199–203, 210–214
See application file for complete search history.

(56) References Cited

U.S. PATENT DOCUMENTS

| | | | | |
|---|---|---|---|---|
| 4,485,337 A | * | 11/1984 | Sandusky | 388/812 |
| 4,658,786 A | * | 4/1987 | Foss et al. | 123/406.13 |
| 5,831,462 A | * | 11/1998 | Witt et al. | 327/199 |
| 6,195,786 B1 | * | 2/2001 | Raghunathan et al. | 716/2 |
| 2005/0278664 A1 | | 12/2005 | Chaudhry et al. | |

* cited by examiner

*Primary Examiner*—Vuthe Siek
(74) *Attorney, Agent, or Firm*—Yee & Associates, P.C.; Matthew B. Talpis

(57) ABSTRACT

A computer implemented power optimization method that generates statistics relating to the clock gating of a set of components in a VLSI design. A set of components, including those components which are not clock gated, are identified. The generation of statistics related to clock gating testing identify whether one or more components of the set of components may be clock gated.

2 Claims, 5 Drawing Sheets

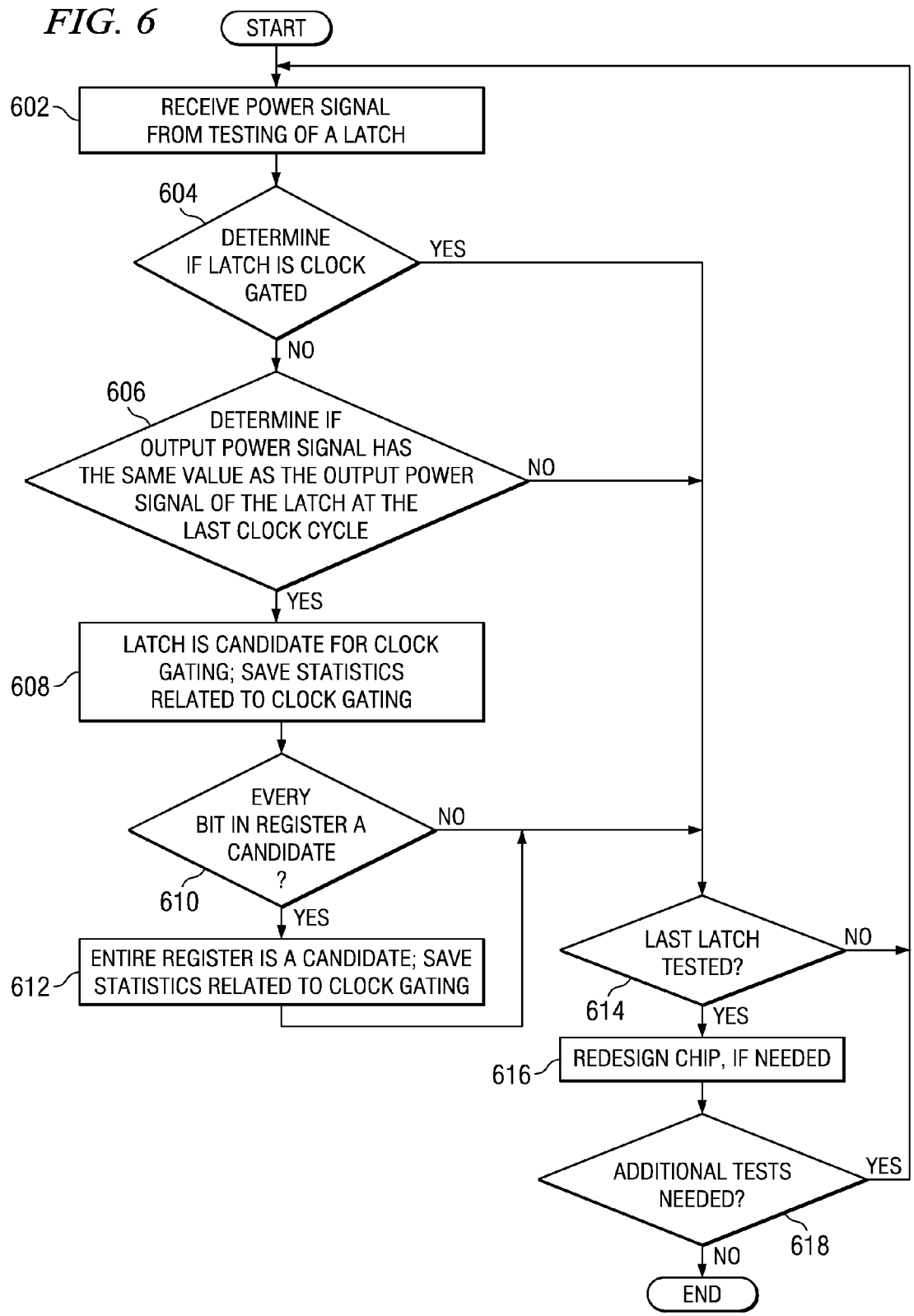

METHOD FOR OPTIMIZING POWER IN A VERY LARGE SCALE INTEGRATION (VLSI) DESIGN BY DETECTING CLOCK GATING OPPORTUNITIES

BACKGROUND OF THE INVENTION

1. Field of the Invention

The present invention relates generally to an improved data processing system and in particular to design of computer chips. Still more particularly, the present invention relates to a computer implemented method for detecting clock gating opportunities within a computer chip in order to find opportunities for saving power in the computer chip.

2. Description of the Related Art

Modern computer chips consume a large amount of power relative to older computer chips. Consumption of a large amount of power can cause a computer chip to become hot. The computer chip can become so hot that the chip ceases to function properly. Self-generated heat can even cause a chip to be permanently damaged or non-functional.

To address this problem, modern computer chips are equipped with fans, liquid cooling devices, or other heat-dissipation devices. However, these devices can be expensive and bulky. These devices can use so much power that a battery-powered computer cannot practically use the modern computer chip.

SUMMARY OF THE INVENTION

The aspects of the present invention provide for a computer implemented method, for generating statistics for a set of components in a computer chip. An exemplary computer implemented method includes identifying the set of components in the computer chip. The set of components include those components which are not clock gated. The exemplary method also includes generating statistics for the set of components. The statistics are related to clock gating testing to identify whether one or more components of the set of components can be clock gated.

BRIEF DESCRIPTION OF THE DRAWINGS

The novel features believed characteristic of the present invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 6 is a flowchart showing a method of a chip design process, in accordance with an illustrative embodiment.

DETAILED DESCRIPTION OF THE PREFERRED EMBODIMENT

Figure 1:
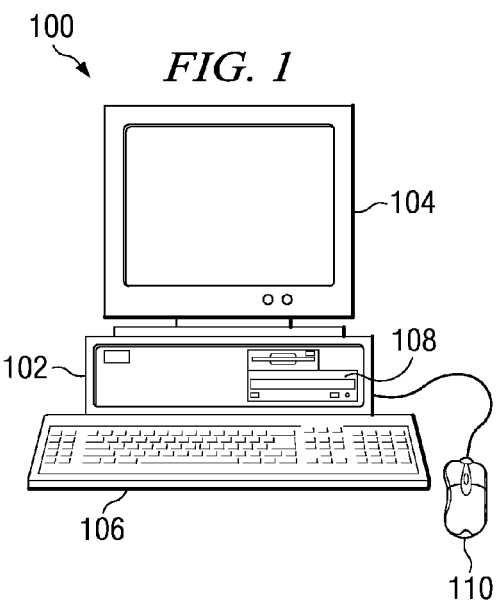
FIG. 1 shows a data processing system in which the illustrative embodiments may be implemented.

With reference now to the figures and in particular with reference to FIG. 1, a pictorial representation of a data processing system is shown in which the illustrative embodiments may be implemented. Computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 may be any suitable computer, such as an IBM® eServer™ computer or IntelliStation® computer, which are products of International Business Machines Corporation, located in Armonk, N.Y. Although the depicted representation shows a personal computer, other embodiments may be implemented in other types of data processing systems, such as a network computer. Computer 100 also preferably includes a graphical user interface (GUI) that may be implemented by means of systems software residing in computer readable media in operation within computer 100.

Figure 2:
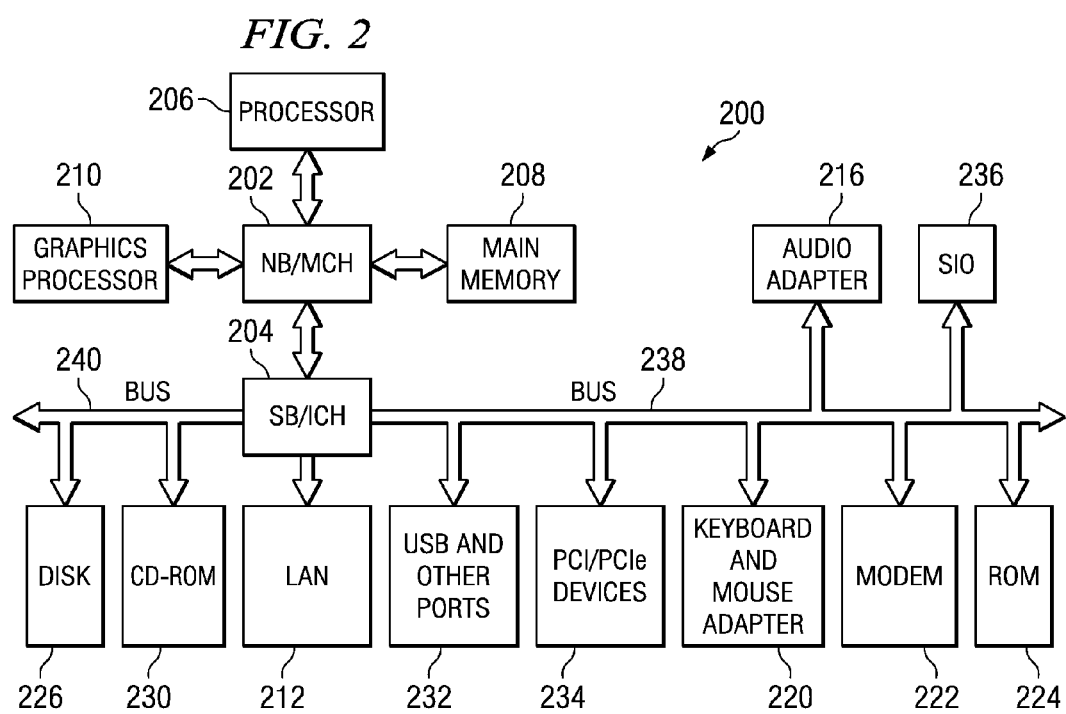
FIG. 2 is a block diagram of a data processing system in which illustrative embodiments may be implemented.

With reference now to FIG. 2, a block diagram of a data processing system is shown in which illustrative embodiments may be implemented. Data processing system 200 is an example of a computer, such as computer 100 in FIG. 1, in which code or instructions implementing the processes of the embodiments may be located. In the depicted example, data processing system 200 employs a hub architecture including a north bridge and memory controller hub (MCH) 202 and a south bridge and input/output (I/O) controller hub (ICH) 204. Processor 206, main memory 208, and graphics processor 210 connect to north bridge and memory controller hub 202. Graphics processor 210 connect to the MCH through an accelerated graphics port (AGP), for example.

In the depicted example, local area network (LAN) adapter 212 is coupled to south bridge and I/O controller hub 204 and audio adapter 216, keyboard and mouse adapter 220, modem 222, read only memory (ROM) 224, universal serial bus (USB) ports and other communications ports 232, and PCI/PCIe devices 234 connect to south bridge and I/O controller hub 204 through bus 238, and hard disk drive (HDD) 226 and CD-ROM drive 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be coupled to south bridge and I/O controller hub 204.

An operating system runs on processor 206 and coordinates and provides control of various components within data processing system 200 in FIG. 2. The operating system may be a commercially available operating system such as Microsoft® Windows® XP (Microsoft and Windows are trademarks of Microsoft Corporation in the United States, other countries, or both). An object oriented programming system, such as the Java® programming system, may run in conjunction with the operating system and provides calls to the operating system from Java® programs or applications executing on data processing system 200 (Java is a trademark of Sun Microsystems, Inc. in the United States, other countries, or both).

Storage devices in data processing system 200 store instructions for the operating system, the object-oriented programming system, and applications or programs. These storage devices are, for example, as hard disk drive 226. Processor 206 causes these instructions to be loaded into main memory 208 for execution. Processor 206 performs the processes of the illustrative embodiments using computer implemented instructions, which may be located in a memory such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in north bridge and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

As described above, power consumption in a computer chip can be a problem. For this reason and other reasons, designing computer chips to avoid or minimize the use of these cooling devices and methods is desirable. Thus, it would be advantageous to have methods and devices for designing a computer chip such that the computer chip uses a minimum amount of power.

The aspects of the present invention provide for a computer implemented method for generating statistics for a set of components in a computer chip. An exemplary computer implemented method includes identifying the set of components in the computer chip. The set of components include those components which are not clock gated. The exemplary method also includes generating statistics for the set of components. The statistics are related to clock gating testing to identify whether one or more components of the set of components can be clock gated.

The term "clock gated" means that a component, such as a latch or set of latches, is prevented from detecting the output of a clock. If a set of components cannot detect the output of a clock, then the set of components will not actuate, toggle, or update. The set of components can be one or more latches, switches, or other components in a computer chip. Therefore, the output of the set of clock gated components remains the same from clock cycle to clock cycle, even if some other input to the set of components is detected. In contrast, when a set of components can detect the output of a clock, the set of components may be actuated, toggled, or updated, which can change the output of the set of components. In other words, the effect of "clock gating" a set of components is to prevent the set of components from updating at each clock cycle.

"Clock gating" can be accomplished by using a circuit, typically a "NAND" gate or other logic circuit, that blocks the propagation of the clock to a set of components, such as a latch or a number of latches. The signal input of the "NAND" gate circuit "gates off the clock." The term "gates off the clock" means that the signal input of the "NAND" gate blocks the clock signal from reaching the set of components. The clock signal does not reach the set of components because of the action of the "NAND" gate.

Once the set of components is identified, statistics are generated for the set of components. The statistics are related to clock gating testing. Clock gating testing is a workload that runs in a simulation or testing of a computer chip. Clock gating testing is testing operation of a set of components, such as a latch or a number of latches, while the set of components are clock gated.

Furthermore, the methods and mechanisms of the depicted embodiments determine whether a set of components is a candidate for clock gating testing. Testing software and/or hardware performs the determination if a set of components in a computer chip is a candidate for clock gating testing. Responsive to a determination that the set of components is a candidate for clock gating testing, the testing software and/or hardware produces a statistic related to performance of clock gating of the set of components. The statistic can be any statistic relating to clock gating of the set of components. The set of components can be a latch, a number of latches, or other components in a computer chip.

Examples of statistics include the percentage of a cycle that each latch being tested was clock gated, a list of cycles that each latch being tested was clock gated, and a percentage of bits in a register, of which the latch is apart, that could have been clock gated for each cycle. These statistics can be used to find opportunities for re-designing the computer chip in a way that causes the computer chip to use less power. For example, if clock gating testing indicates that certain latch operations are not needed for a particular function, then an engineer can redesign the chip such that the latches in question do not actuate during operation of the function.

Figure 3:
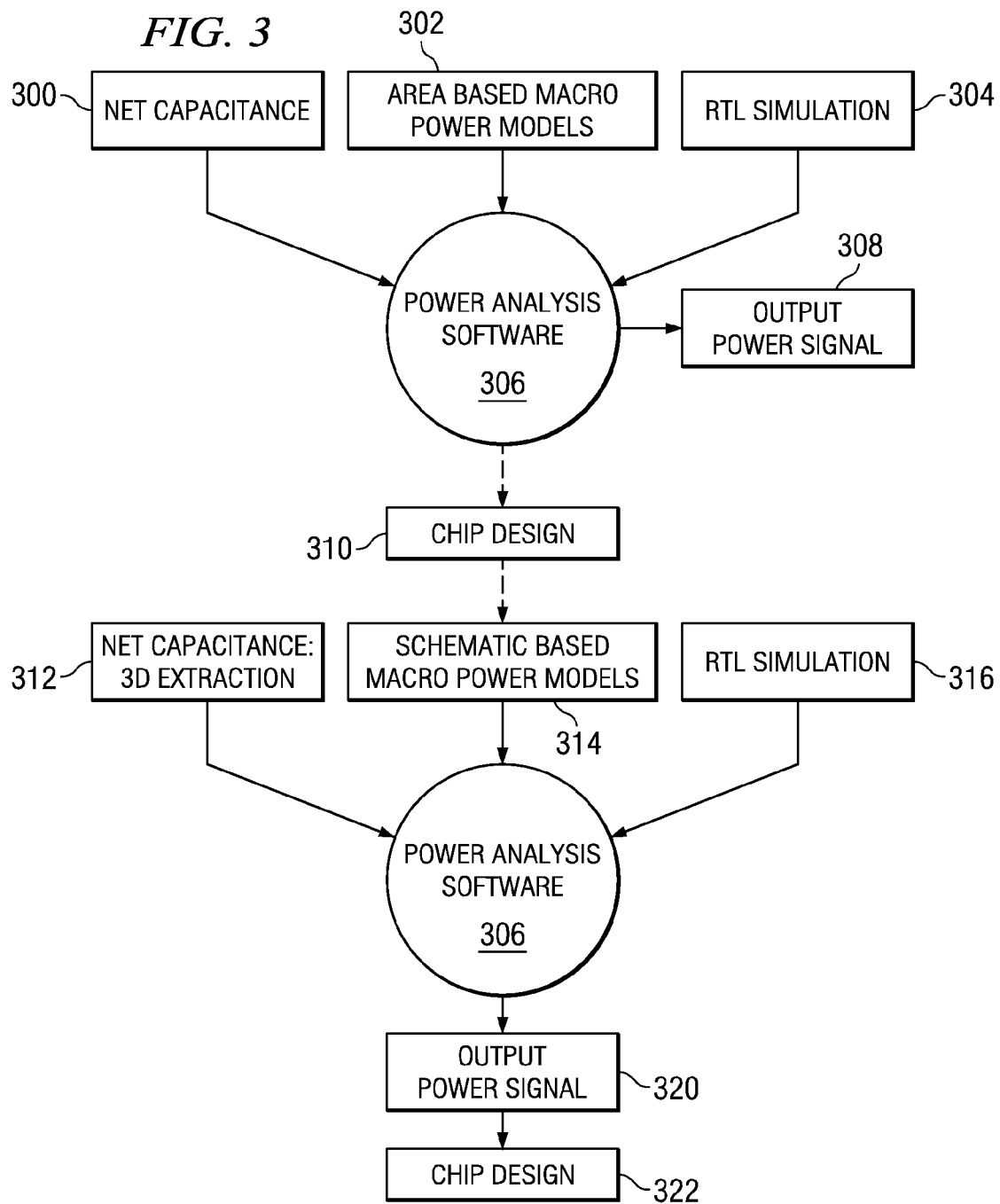
FIG. 3 is a block diagram showing power analysis in a chip design process, in accordance with an illustrative embodiment.

FIG. 3 is a block diagram showing power analysis in a chip design process, in accordance with an illustrative embodiment. The elements shown in FIG. 3, particularly power analysis software 306 and power analysis software 316, operate within a data processing system, such as data processing system 100 shown in FIG. 1 and data processing system 200 shown in FIG. 2. In other illustrative examples, power analysis software 306 can be replaced by hardware or a combination of hardware and software.

Power analysis software 306 calculates a power output signal 308 for use by a user or some other technician involved with designing a computer chip. A power output signal is a signal that contains information relating to the amount of power used or detected. Computer chips can include any kind of computer chip such as, for example, processors or a very large scale integration (VLSI) chip. An example of power analysis software is TEXPOWER® available from International Business Machines Corporation of Armonk, N.Y. Another example of power analysis software is CAPET® (Cycle Accurate Power Estimate Tool). However, power analysis software 306 can be any power analysis software and also can be implemented using suitable hardware.

In the example shown in FIG. 3, power analysis software 306 determines a chip's power consumption using simulation runs, timing information, and macro energy rules. Timing runs provide global net capacitance 300 for signals between macros. Signals, or nets, connecting macros have capacitance that is charged and discharged during switching activity. Information relating to net capacitance is gathered for accurate power estimation to produce a power output signal. Global net capacitance, or the net capacitance of an entire computer chip, can be determined using Steiner estimates. Steiner estimates are known in the art. See for example, *Placement Driven Synthesis Case Studies on Two Sets of Two Chips: Hierarchical and Flat* by Peter J. Osler, available for download at the website for the Association for Computing Machinery (ACM) Special Interest Group on Design Automation (SIGDA).

In addition, area-based macro power models 302 provide power model information based on switching factors and clock gating. For example, if a macro does not have a power rule ready, the size estimate of the macro is used and multiplied by a chosen W/mm^2 value as a default to produce a macro power model. Register transfer level (RTL) simulations 304 determine switching factors for net power consumption, macro inputs, and clock gating on local clock buffers. Different kinds of logic simulator are available. A register transfer level simulator is not an analog simulation, it is a description of logic that can be simulated using 1, 0, X, and Z as values for signals in the simulation. For example, "CADENCE NCSIM®" is a commercial register transfer level simulator.

A switching factor is an internal transitioning of a signal. Through use of a register transfer level simulator, these internal signals can be monitored. Ultimately, power analysis software 306 provides a cycle by cycle power estimate for each macro tested by using the information provided by net capacitance 300, area-based macro power models 302, and RTL simulations 304. All macro data and net power consumption data are accumulated to determine power output signal 308.

A user employs power output signal 308 to identify where in a chip design power can be saved in a set of components in the computer chip. A component is some part of a computer chip. Example components are latches or switches in a computer chip. A latch is a logic circuit that holds a value from one execution cycle to the next.

For example, if a particular operation is causing a group of latches in a register to be thrown, then a user can redesign the chip such that those latches are not thrown during that particular operation. Similarly, new data need not be pulled into a register that does not update. Because new data is not needed, the operation in the register is not necessary. Preventing the latches from toggling, flipping, actuating, or being thrown is desirable in this case because power can be saved if the latches, or other set of components, do not actuate.

In another illustrative example, a computer chip design can be changed to save power by adding logic to gate off a register for conditions when a workload does not require updating the register. In yet another illustrative example, a computer chip can be designed to break a register into two or more subregisters to achieve more clock gating and lower power consumption. In still another illustrative example, a computer chip can be designed such that two registers that clock gate identically are combined. Combining registers that perform clock gating identically reduces the number of local clock buffers and reduced clock grid power consumption. Thus, a user or a technician can use power output signal 308 to implement a new design 310 for the chip in question. In new chip design 310, these factors will be taken into account in order to design a computer chip that uses less power relative to the previous design of the same computer chip.

After creating a new chip based on new chip design 310, the power analysis process can be repeated. During this and subsequent tests on the chip, the same or different tests can be performed. Examples of different tests include using a three-dimensional extraction technique to determine net capacitance 312, schematic-based macro power models 314, and other forms of RTL simulations 316. The information gained from these tests is provided to power analysis software 306, as described above. Power analysis software 306 then produces power output signal 320, which can be characterized as a second power output signal. In these examples, a user employs power output signal 320 to create chip design 322 in the manner described above with respect to chip design 310. Chip design 322 can be characterized as a second ship design. A chip manufactured according to chip design 322, in this illustrative example, uses less power than a chip manufactured according to chip design 310.

Figure 4:
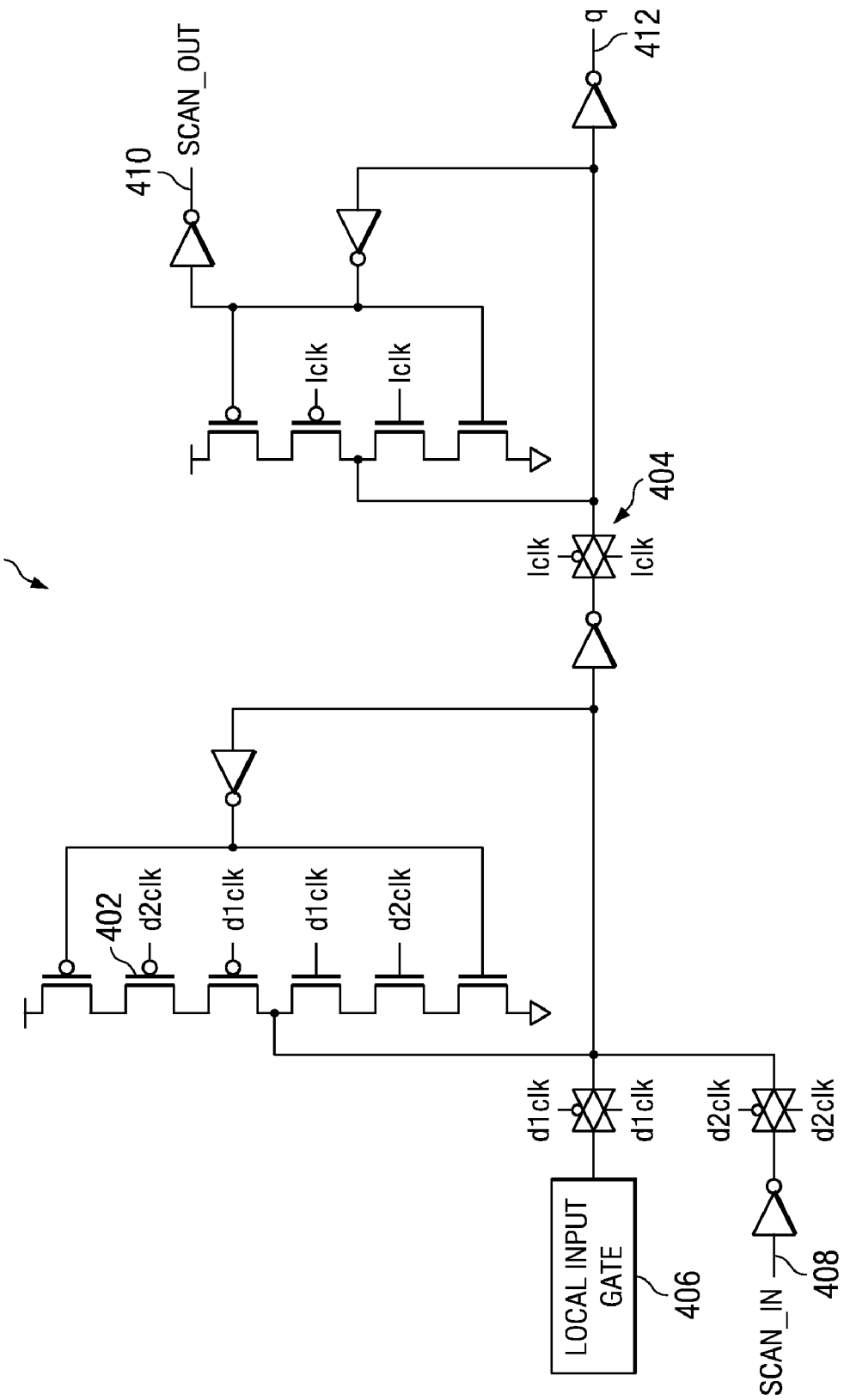
FIG. 4 is a circuit in which the power analysis described in FIG. 3 can be implemented, in accordance with an illustrative embodiment.

FIG. 4 is a circuit in which the power analysis described in FIG. 3 can be implemented, in accordance with an illustrative embodiment. Circuit 400 shown in the illustrative example of FIG. 4 is a master-slave flip flop computer chip. Circuit 400 contains a number of clocks, such as d2clk 402 and lclk 404, among other clocks. Circuit 400 also has local input gate 406, scan-in input 408 into which test data is scanned, scan-out output 410 out of which test data is scanned, and an output "q" 412. The scan in and out signals are part of a chain that connect the registers in series. The d* clock are use for the first flip flop and the l* clocks are used for the second flip flop. D1 and d2 are used for normal operation and test operation, respectfully.

FIG. 4 is an example of a latch upon which the process described with respect to FIG. 3 and FIG. 6 can be implemented. The latch itself is not changed during testing. Instead, what is of interest is the inputs that gate a clock to the latch.

Figure 5:
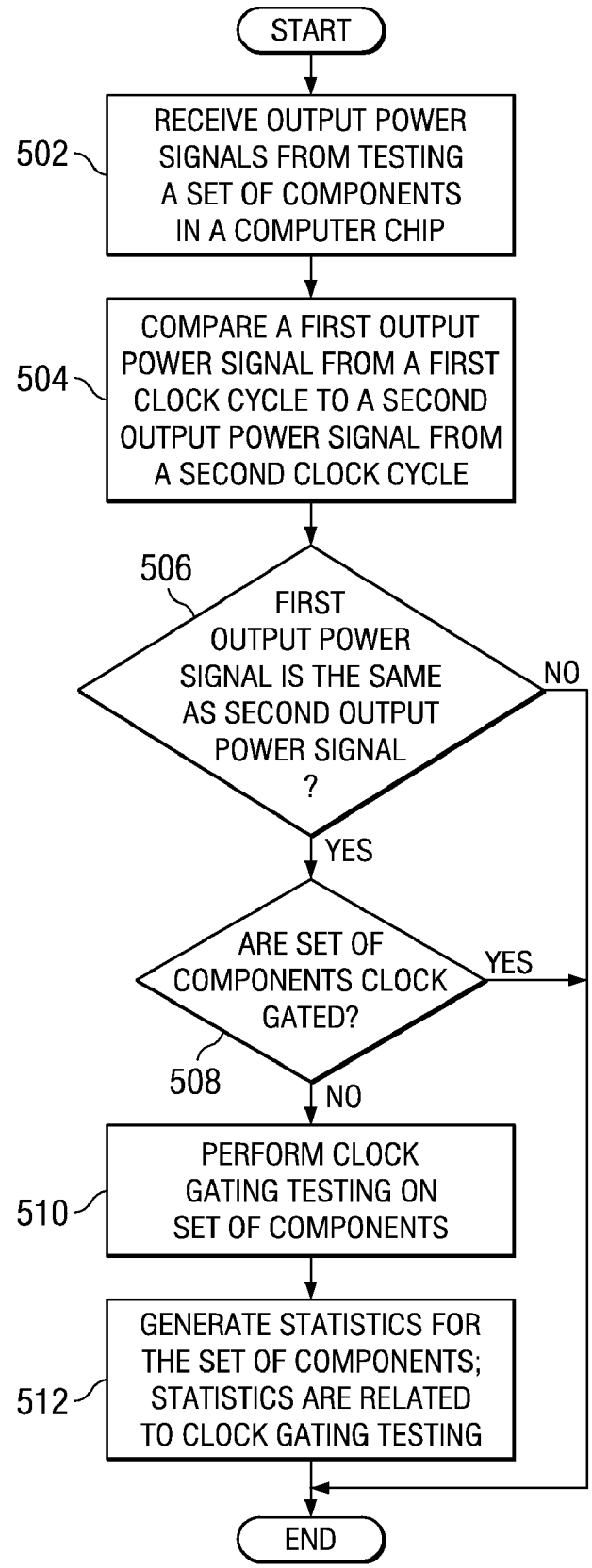
FIG. 5 is a flowchart showing a method of generating statistics for a set of components in a computer chip.

FIG. 5 is a flowchart showing a method of generating statistics for a set of components in a computer chip. The chip design process shown in FIG. 5 can be implemented using the devices and methods described with respect to FIG. 3 and can be executed on a data processing system, such as data processing system 100 shown in FIG. 1 and data processing system 200 shown in FIG. 2. Power analysis can be performed by power analysis software, such as power analysis software 306 described in FIG. 3. Power analysis software can produce a power output signal from testing a set of components in a computer chip.

Initially, software receives power output signals from testing a set of components in a computer chip (step 502). The software can be the power analysis software, or can be software specifically designed to generate statistics related to the set of components. The set of components can be one or more latches, one or more switches, or one or more components in a computer chip that may benefit or use clock gating.

In an illustrative example, the output power signals includes a first output power signal and a second output power signal. Each of the first and second output power signals include information related to how much power the set of components output or used during a given clock cycle. Thus, the first output power signal includes information related to output power from the set of components during a first clock cycle. Similarly, the second output power signal includes information related to output power from the set of components during a second clock cycle. In other embodiments, output power signals can include any number of sets of output power, each set including information related to output power from the sets of components during a particular clock cycle.

Continuing the illustrative example, the software compares the first output power signal to the second output power signal (step 504). However, as described above, more than two sets of power signals can be compared, where each set of power signals contains information relating to the power output from a particular set of components.

Software and/or hardware then determines if the first output power signal is the same as the second output power signal (step 506). In an illustrative example, the determination is made if the first power output signal is exactly the same as the second power output signal because the set of components is represented by one or more digital latches that either output power or do not output power. In other illustrative examples, the determination is made whether the first power output signal is substantially the same as the second power output signal, where the first and second power output signals can vary slightly. In this case, the power output would vary by about 5% or less. If the first and second output power signals are not substantially the same, then the process terminates.

The determination of whether the first power signal output is the same as the second power output signal is made for the following reasons. If the set of components, which can be latches, are flipped, toggled, or actuated, then it is assumed that the set of components are actuated for a good reason. The exact function of the set of components is not being determined or analyzed; but rather, a determination is being made as to whether power can be saved in a computer chip by clock gating sets of components that do not actuate from clock cycle to clock cycle. Thus, if a set of components actuates, it is assumed that that set of components should not be clock gated. If, on the other hand, a set of components does not actuate at a given clock cycle, then that set of components will be a candidate for clock gating, as described below. Whether a set of components actuates over a number of clock cycles is determined by analyzing the power output of the set of components over a number of clock cycles. Expressed differently, if the power output of the set of components does not change, then the set of components is not actuating, which means that the set of components are candidates for clock gating.

Thus, if the first and second output power signals are substantially the same, then software and/or hardware determines if the set of components are already clock gated (step 508). The determination of whether a set of components is already clock gated is made by probing whether a clock signal reaches a particular set of components. For example, a latch can be observed by the software and/or hardware to determine if the latch detected a clock signal. Software and/or hardware probes the signal from one clock pulse to another clock pulse, which is most often performed during simulated operation of a computer chip.

If the set of components are clock gated, then the process terminates. The purpose of the algorithm is to identify which components can be clock gated, but are not clock gated, so that those components possibly can be clock gated in order to save power. Thus, the process terminates if the set of components are clock gated because no further action can be taken with respect to that set of components in this regard.

However, if the set of components are not clock gated, then testing software performs clock gating testing on the set of components (step 510). The testing software then generates statistics for the set of components (step 512). The statistics are related to the clock gating testing to identify whether one or more components of the set of components can be clock gated.

Statistics related to clock gating testing can be a percentage of a cycle that a latch or set of components could have been clock gated, a percentage of a cycle that each latch or set of components was clock gated, the percentage of a cycle that an entire register of latches or set of components in the computer chip could have been clock gated, and the percentage of a cycle that the entire register or set of components was clock gated. Other examples of statistics related to clock gating testing include a list of cycles that the latch or set of components could have been clock gated; a list of cycles that the latch or set of components was clock gated; a list of cycles that a register, of which the latch or set of components is apart, could have been clock gated; a list of cycles that a register or set of components was clock gated; and a percentage of bits in a register, of which the latch or set of components is a part, that could have been clock gated for each cycle. Still other examples of statistics related to clock gating testing include a list including latches or set of components and registers of set of components, sorted using data from the statistics already listed. For example, a list of registers of sets of components or a list of registers of latches can be created and then sorted using the value corresponding to the percentage of latches or sets of components that could have been clock gated divided by the percentage of latches or sets of components that were clock gated.

FIG. 6 is a flowchart showing a method of a chip design process, in accordance with an illustrative embodiment. FIG. 6 also shows an alternate version of the process shown in FIG. 5. The chip design process shown in FIG. 6 can be implemented using the devices and methods described with respect to FIG. 3 and can be executed on a data processing system, such as data processing system 100 shown in FIG. 1 and data processing system 200 shown in FIG. 2. Power analysis can be performed by power analysis software, such as power analysis software 306 described in FIG. 3.

Initially, power analysis software receives output power signals as a result of testing a latch or other component (step 602). Output power signals are generated for each clock cycle during operation of the latch. For example, during two clock cycles the testing software can receive a first output power signal, wherein the first output power signal corresponds to the output power of the latch during a first clock cycle of the latch during clock gating testing. The testing software can also receive second output power signal, wherein the second output power signal corresponds to the output power of the latch during a second clock cycle of the latch during clock gating testing.

A latch is tested by operating the computer chip containing the latch. During operation of the computer chip, the latch may be clock gated, or may not be clock gated. The testing software or a user identifies a set of components in the computer chip which are not clock gated. In this illustrative example, the set of components is a latch. If the latch is not clock gated (step 604), then optionally the test software or hardware determines if the output power signal for the set of components has the same value as the output power signal for that set of components from the last clock cycle (step 606). Thus, continuing the above example, the testing software compares the first output power signal to the second output power signal.

If the first output power signal has the same value as the second output power signal from the last clock cycle (step 606), then the latch is a candidate for clock gating testing. Clock gating testing is a workload that runs in a simulation or testing of a computer chip. In this case, the test software and/or hardware controlling the testing cause statistics related to the performance of clock gating of the latch to be saved (step 608). The statistics are related to clock gating testing to identify whether one or more components of the set of components can be clock gated Examples of statistics related to clock gating testing are provided in relation to FIG. 5.

Next, the test software or hardware determines whether every bit in a register is a candidate for clock gating (step 610). If every bit in a register is a candidate for clock gating, then the entire register is a candidate for clock gating. In this case, test software or hardware causes statistics related to the clock gating to be saved (step 612). Next, the test software or hardware determines whether the latch or latches just tested constitute the last latch to be tested (step 614). If the last latch has not been tested, then additional latches remain to be tested. In this case, the chip design process returns to step 602.

If the last latch has been tested, then optionally the user redesigns the computer chip containing the latches (step 616). In an illustrative example, a user redesigns the computer chip to save power. In another illustrative example, the chip already performs at optimum power efficiency and does not need to be redesigned. In yet another illustrative example, a software program or hardware automatically redesigns the computer chip.

With reference back to step 604, if the tested latch is clock gated, then the testing process proceeds directly to step 616, as described above. Similarly, if output data has the same value as the last cycle (step 606) or, later, if every bit in a register is not a candidate for clock gating (step 610), then the testing process proceeds directly to step 616, as described above.

In any case, power analysis software or a user then determines whether additional tests are needed (step 618). If additional tests are needed on the same computer chip or on a redesigned computer chip, then the chip design process returns to step 602 and the chip design process repeats. If additional tests are not needed, then the chip design process terminates.

The devices and methods for performing clock gating of latches in a computer chip, as described above, have several advantages when designing computer chips. For example, the methods and devices described herein allow a computer chip designer to evaluate clock gating opportunities. A clock gating opportunity can be described as a location in a computer chip where a set of components, such as one or more latches or switches, can be clock gated to prevent the set of components from detecting a clock signal. A clock gating opportunity can also be described as a place in a computer chip where candidate latches can be re-arranged, deleted, or otherwise modified such that the final manufactured computer chip consumes less power.

The aspects of the present invention identify latches and other components in a computer chip using clock gating testing. The latches or other components can be modified in a subsequent computer chip design or re-design such that the subsequent computer chip design consumes less power. In addition, the methods and devices described herein allow a computer designer to design power-efficient computer chips more quickly, relative to previous computer chip design techniques. The terms "design" and "re-design" refer to a process of designing and/or creating a computer chip and defining the relationships of components and sets of components within the computer chip.

The invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, or transport the program for use by or in connection with the instruction execution system, apparatus, or device.

The medium can be an electronic, magnetic, optical, electromagnetic, infrared, semiconductor system, or apparatus or device. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk, read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the embodiments of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer-implemented method of optimizing power consumption in a Very Large Scale Integration (VLSI) design, the method comprising:
   performing a power analysis on a set of components within the design, the performing comprising:
   generating a first power output signal during a first clock cycle of a simulation of the set of components, the first power output signal representing a first power output value;
   generating a second power output signal during a second clock cycle of the simulation of the set of components, the second power output signal representing a second power output value; and
   comparing the first power output signal to the second power output signal;
   determining, based on the power analysis, whether the set of components is a candidate for clock gating, wherein the determining comprises evaluating the comparison of the first power output signal and the second power output signal, wherein a result of the evaluation consists of one of a difference, an equality, and a substantial equality; and
   responsive to the result of the evaluation being an equality, marking the set of components as a candidate for clock gating;
   responsive to determining that the set of components is a candidate for clock gating, obtaining clock gating data from a simulation of the set of components, the clock gating data including statistics on at least one of a percentage of clock cycles that the set of components is potentially clock gated, a percentage of clock cycles that the set of components is clock gated, a percentage of clock cycles that a register in the set of components is clock gated, a percentage of clock cycles that a percentage of bits of a register is clock gated, and a percentage of clock cycles that a latch in a set of components is clock gated; and optimizing the VLSI design based on the clock gating data, wherein the optimizing comprises modifying the VLSI design.

2. A computer program product comprising a computer-readable medium tangibly embodying computer usable program code, which when executed by a processor, perform actions that optimize power consumption, the actions comprising:

performing a power analysis on a set of components within a Very Large Scale Integration (VLSI) design, the performing comprising:

generating a first power output signal during a first clock cycle of a simulation of the set of components, the first power output signal representing a first power output value;

generating a second power output signal during a second clock cycle of the simulation of the set of components, the second power output signal representing a second power output value; and comparing the first power output signal to the second power output signal;

determining, based on the power analysis, whether the set of components is a candidate for clock gating, wherein the determining comprises evaluating the comparison of the first power output signal and the second power output signal, wherein a result of the evaluation consists of one of a difference, an equality, and a substantial equality; and responsive to the result of the evaluation being an equality, marking the set of components as a candidate for clock gating;

responsive to determining that the set of components is a candidate for clock gating, obtaining clock gating data from a simulation of the set of components, the clock gating data including statistics on at least one of a percentage of clock cycles that the set of components is potentially clock gated, a percentage of clock cycles that the set of components is clock gated, a percentage of clock cycles that a register in the set of components is clock gated, a percentage of clock cycles that a percentage of bits of a register is clock gated, and a percentage of clock cycles that a latch in a set of components is clock gated; and optimizing the VLSI design based on the clock gating data, wherein the optimizing comprises modifying the VLSI design.

* * * * *